United States Patent
Snyder et al.

(10) Patent No.: US 6,805,745 B2
(45) Date of Patent: Oct. 19, 2004

(54) LARGE SIZE SINGLE CRYSTAL SEED CRYSTAL FABRICATION BY INTERGROWTH OF TILED SEED CRYSTALS

(75) Inventors: David W. Snyder, Leechburg, PA (US); William J. Everson, Cabot, PA (US)

(73) Assignee: II-VI Incorporated, Saxonburg, PA (US)

( * ) Notice: Subject to any disclaimer, the term of this patent is extended or adjusted under 35 U.S.C. 154(b) by 26 days.

(21) Appl. No.: 10/221,392

(22) PCT Filed: Mar. 13, 2001

(86) PCT No.: PCT/US01/08047

§ 371 (c)(1),
(2), (4) Date: Sep. 11, 2002

(87) PCT Pub. No.: WO01/68957

PCT Pub. Date: Sep. 20, 2001

(65) Prior Publication Data

US 2003/0029376 A1 Feb. 13, 2003

Related U.S. Application Data

(60) Provisional application No. 60/188,784, filed on Mar. 13, 2000.

(51) Int. Cl.⁷ .......................... C30B 25/02; C30B 25/04
(52) U.S. Cl. ................. 117/105; 117/105; 252/62.3 C; 423/328.2
(58) Field of Search ............................... 117/100, 105; 252/62.3 C; 423/328.2

(56) References Cited

U.S. PATENT DOCUMENTS

| | | | |
|---|---|---|---|
| 4,147,572 A | 4/1979 | Vodakov et al. | |
| 4,866,005 A | 9/1989 | Davis et al. | |
| RE34,861 E | 2/1995 | Davis et al. | |
| 5,433,167 A | 7/1995 | Furukawa et al. | |
| 5,441,011 A | 8/1995 | Takahaski et al. | |
| 5,611,955 A | * 3/1997 | Barrett et al. | 252/62.3 C |
| 5,667,587 A | * 9/1997 | Glass et al. | 117/200 |
| 5,683,507 A | * 11/1997 | Barrett et al. | 117/200 |
| 5,746,827 A | * 5/1998 | Barrett et al. | 117/100 |
| 5,788,768 A | 8/1998 | Barrett et al. | |
| 5,873,937 A | 2/1999 | Hopkins et al. | |
| 6,139,632 A | 10/2000 | Izumi | |

OTHER PUBLICATIONS

A.S. Jordan, R. Caruso, and A.R. Von Neida, "A Thermoelastic Analysis of Dislocation Generation in Pulled GaAs Crystals", The Bell System Technical Journal, p. 593, vol. 59, No. 4, Apr. 1980.

A.S. Jordan, A.R. Von Neida, and R. Caruso, "The Theory and Practice of Dislocation Reduction in GaAs and InP", Journal of Crystal Growth, p. 555, vol. 70, 1984.

\* cited by examiner

*Primary Examiner*—Felisa Hiteshew
(74) *Attorney, Agent, or Firm*—Webb Ziesenheim Logsdon Orkin & Hanson, P.C.

(57) ABSTRACT

Disclosed is a method for reproducibly producing large size, single crystals in a crystal growth chamber. The method includes the steps of: (a) forming a plurality of smaller size tiles of single crystals of substantially the same crystal orientation as the desired large size, single crystal; (b) assembling the plurality of smaller tiles into a structure having a larger size while minimizing gapping between adjacent tiles; (c) placing the assembly of smaller tiles formed in step (b) into a growth chamber; and (d) through a growth reaction carried out in the growth chamber, forming a large size single crystal using the assembly of smaller tiles formed in step (b) as a seed crystal for the growth reaction.

15 Claims, 4 Drawing Sheets

Step A     Step B     Step C

LARGE SIZE SINGLE CRYSTAL SEED CRYSTAL FABRICATION BY INTERGROWTH OF TILED SEED CRYSTALS

This application claims benefit of Ser. No. 06/188,784, filed Mar. 13, 2000.

BACKGROUND OF THE INVENTION

1. Field of the Invention

This invention relates to the growth of large size or diameter, high quality, semiconductor-grade, single crystals of silicon carbide or other materials for optical and electronic device applications.

2. Description of the Prior Art

Single crystals of materials such as silicon carbide (SiC), at least in large diameters, are often grown in a physical vapor transport (PVT) reactor. A source of a growth material, such as a source powder of silicon, is placed at the bottom of a reaction chamber and a seed crystal is attached to the opposite surface of the reaction chamber, and above the source powder, to provide a base for further growth. The source powder is heated up in various known ways to produce a vapor, and a temperature differential is maintained between the source powder and the seed crystal. The vaporized powder condenses on the seed crystal and begins to form a solid, continuous mass of a single crystal of material of a particular polytype. Prior art patents in this area include, for example, U.S. Pat. Nos. 5,683,507; 5,611,955; 5,667,587; 5,746,827; and Re. 34,861.

It is desirable in many electronic and optical applications to provide a large size (over two inches) single crystal of SiC or other materials. The common technique used today for manufacturing these large size materials is to produce a large seed for material growth by a slow, gradual enlargement of the diameter of a small seed or starting crystal using a tapered sleeve in a graphite reactor hot zone. This known approach is expensive and time consuming since many growth cycles may be required to achieve relatively small increases in size, while maintaining good crystal quality. It is believed that this results from the outer crystal regions accumulating defects, such as inclusions, secondary grains and micro-pipes.

It is an object of the present invention to overcome the problems with the prior art and readily provide a large seed crystal for growing single crystals of SiC or other materials in a PVT reactor or the like.

SUMMARY OF THE INVENTION

We have invented a method for reproducibly reproducing large size, single crystals in a crystal growth chamber which includes the steps of forming a plurality of smaller size tiles of single crystals of substantially the same crystal orientation as the desired large size, single crystals, assembling the plurality of smaller tiles into a structure having a larger size while minimizing the gapping between adjacent tiles, placing the formed assembly of smaller tiles into a growth chamber and, through a growth reaction carried out in the growth chamber, forming a large size, single crystal using the assembly of smaller tiles as a seed crystal for the growth reaction.

The smaller tiles assembled together to form the seed crystal can either be assembled along substantially the same crystallographic orientation or can be assembled with alternating polarity between adjacent tiles. It is preferred that the smaller tiles be assembled into a structure and fixed to a holder which, in turn, is then placed in the growth chamber. The smaller tiles can be affixed to the holder with an adhesive, such as a sugar solution.

In a preferred embodiment, the growth reaction is first carried out to overgrow the surface of the assembly of smaller tiles and any gaps between adjacent tiles, and then the growth reaction is carried out to grow a large size crystal with the overgrown assembly of smaller tiles functioning as a seed crystal for the growth reaction.

The process of the present invention is particularly suitable for growing large size, single crystal silicon carbide from smaller size tiles of single crystal silicon carbide. The growth reaction carried out in the growth chamber is preferably a physical vapor transport or sublimation reaction. In such an arrangement, the assembly of smaller silicon carbide tiles and a silicon crystal growth source are introduced into a sublimation system, and then the pressure of the system, the temperature of the assembly of smaller tiles, and the temperature of the crystal growth source are adjusted to cause the crystal growth source to vaporize and condense on the assembly of smaller tiles under the conditions required to form a single crystal.

The smaller tiles can be assembled together to form the seed crystal by first preparing a high quality surface on the smaller tiles so as to promote subsequent crystal growth, cutting the tiles to form polygonal tile pieces, assembling the polygonal tile pieces into an assembly of smaller tiles, affixing the assembled tiles onto a seed holder, and then placing the seed holder with the tiles affixed thereto into the growth chamber for subsequent large size, single crystal growth. It is generally preferred that the assembly of smaller tiles be shaped along its outer edges to form a generally circular structure so as to form a generally circular, large size, single crystal.

In one embodiment for growing silicon carbide single crystals, the smaller tile pieces are assembled so that either all of their C-faces or all of their Si-faces are oriented toward the vapor in the growth chamber during the growth reaction process. Alternatively, only some of the C-faces and some of the Si-faces are so oriented, with the ratio of C- and Si-faces so oriented chosen so as to improve growth in the reaction process.

A complete understanding of the invention will be obtained from the following description when taken in connection with the accompanying drawing figures wherein like reference characters identify like parts throughout.

DESCRIPTION OF THE PREFERRED EMBODIMENT

In accordance with the present invention, a larger seed crystal is fabricated by assembling and intergrowing a well-defined array of smaller, high quality seed crystals.

This is also referred to as seed tiling. Through the seed tiling technique of the present invention, a larger diameter seed crystal having large, high quality regions and very narrow, well-defined regions somewhat higher in defect density is provided. As the size of the available seed tiles used in assembling the seed crystal is made larger, the number of tiles required for the assemblage will decrease.

Figure 1:
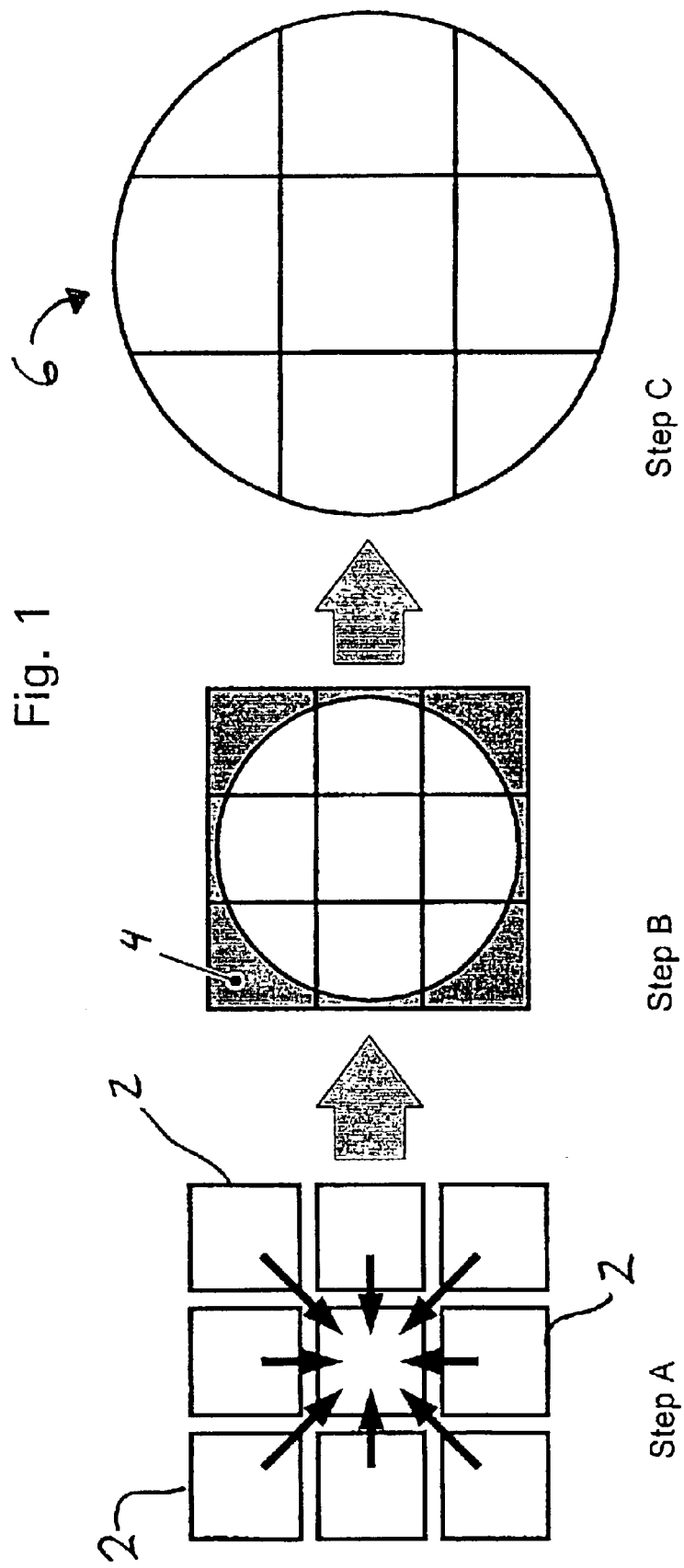
FIG. 1 is a schematic illustration of the steps of the seed tiling process of the present invention.

The process and techniques of the present invention are shown more clearly in FIG. 1. Initially, a flat holding fixture is fabricated. The various seed crystals are diced into, preferably, uniformly-sized, crystallographically-oriented tiles 2. Next, the various seed tiles are affixed to a holder, such as a quartz plate, while minimizing gaps and maximizing alignment, with a glue or adhesive, such as a sugar solution (step A in FIG. 1). Material is removed from the outer edges 4, if necessary, to form a circular seed crystal assemblage 6 (step B in FIG. 1). Polarity may be alternated between tiles to promote lateral overgrowth and to suppress defect generation. Lastly, the formed seed crystal assemblage 6 is mounted to a pedestal (step C in FIG. 1) which, in turn, is placed in a reaction chamber for the normal growth through a physical vapor transport process or other known growth process.

Figure 2:
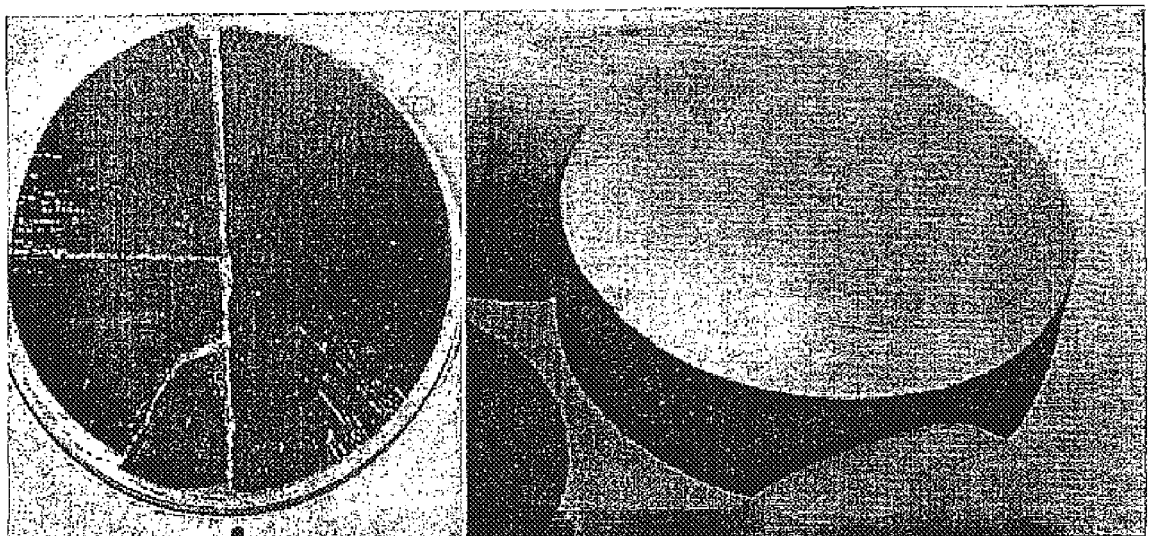
FIG. 2 is a photographic comparison of a SiC crystal (right side) grown from one initial configuration of a tiled seed crystal (left side)
Figure 3:
FIG. 3 is a photographic comparison of a SiC crystal (right side) grown from another configuration of a tiled seed crystal (left side)
Figure 4:
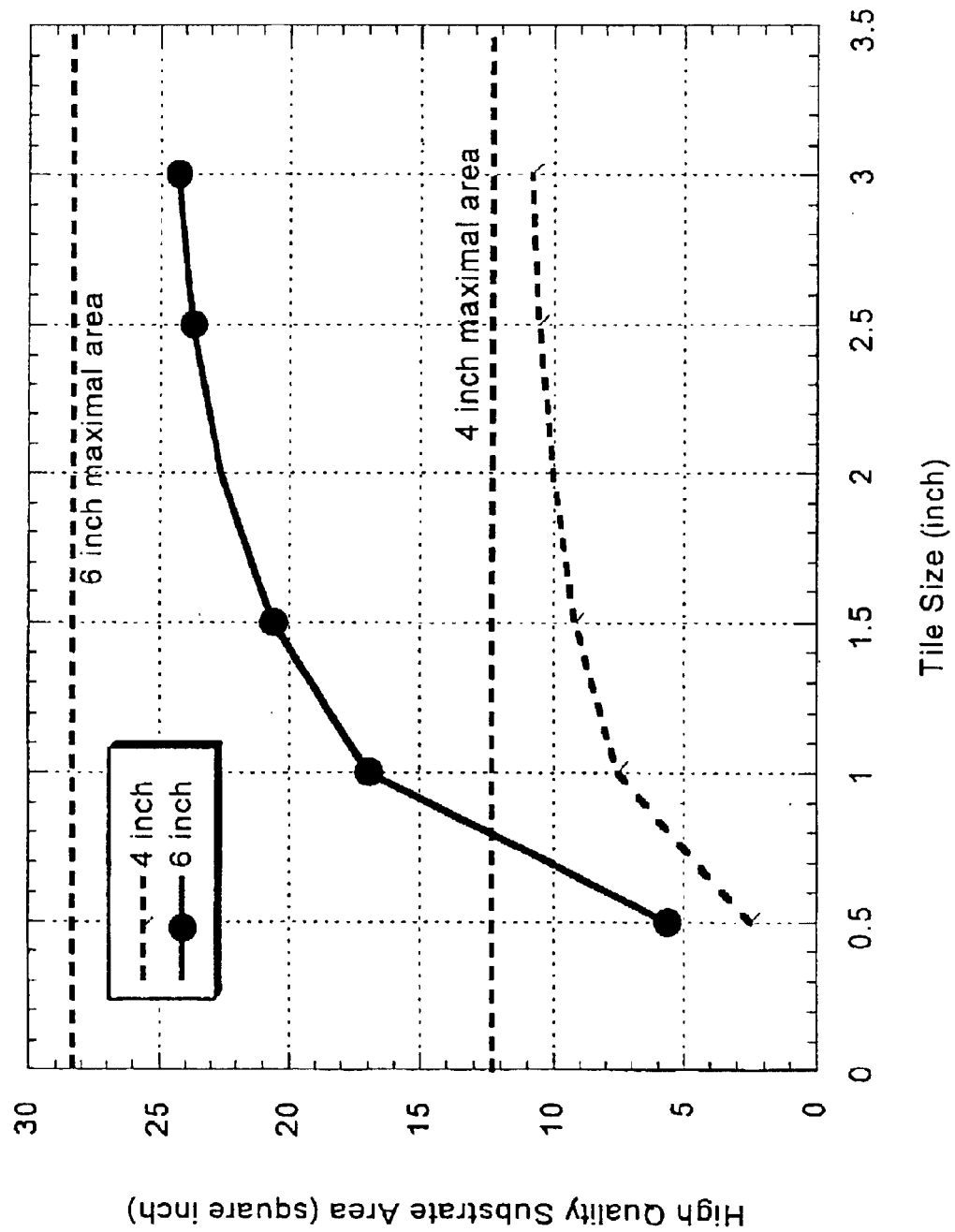
FIG. 4 is a graph showing the relationship between the tile size and the quality regions of a SiC crystal.

FIGS. 2 and 3 each show a single crystal SiC (on the right side) grown from a tiled seed (shown on the left side). The FIG. 3 tiled seed is similar to the configuration shown in FIG. 1. The process of the present invention provides, very quickly and without multiple regrowth steps, a large area seed crystal having a percentage of high quality regions and suitable for the propagation of large (three to six inch diameter) crystals of SiC or other crystal material. Although these high quality crystal regions may initially be bounded by thin, well-defined regions somewhat higher in defect level, subsequent regrowth will reduce the defect density. As the size of available seed tiles increases, the percentage of high quality regions of the seed crystal increases as shown in FIG. 4.

In order to successfully form high yield crystal production of SiC, a low defect seed with the same size and polytype of the SiC crystal being grown is required. Normally, these seeds are created by a long and laborious process of refinement and scale-up. Large diameter seeds facilitate the efficient use of various arrangements of physical vapor transport reactors or other growth systems.

The tiling concept of the present invention uses pieces of available, but smaller size, high quality seeds to piece together large seeds suitable for scale-up in typical reactor systems. The critical steps of the present invention are cutting and fitting the seed tiles together to form a single unit for growth that preserves surface finish and flatness and minimizes gaps between tiles that might encourage spurious or defective growth. To do this, conventional wafers, such as SiC wafers, are mechanically polished with a diamond or other abrasive to assure excellent surface finish and flat and parallel surfaces. The wafers are then diced by a diamond saw into polygonal pieces. These pieces (tiles) are set with adhesive on a seed holder, then heated and pressed into a fixture to assure alignment until bonding is completed. While this is only one example of producing a tiled seed crystal, other arrangements are also within the scope of the present invention.

Once the tiled seed crystal is attached to the seed holder, the seed crystal and the holder are assembled into the hot zone of the reactor just as would a standard seed crystal. The furnace is evacuated and baked out and growth is carried out in the normal manner.

The present invention will lead to a substantial reduction in the cost-per-unit area of single crystals, such as SiC semiconductor wafers, as well as a major increase in wafer quality, by reducing and/or eliminating the density of the two main device degrading defects, mainly micro-pipes and dislocations.

Although the present invention has been described in detail in connection with the discussed embodiment, various modifications may be made by one of ordinary skill in the art without departing from the spirit and scope of the present invention. Therefore, the scope of the present invention should be determined by the attached claims.

We claim:

1. A method for reproducibly producing a large size, single crystal in a crystal growth chamber comprising the steps of:

(a) forming a plurality of smaller size tiles of single crystals of substantially the same crystal orientation;

(b) assembling the plurality of smaller tiles into a structure having a lager size while minimizing gapping between adjacent tiles;

(c) placing the assembly of smaller tiles formed in step (b) into a growth chamber; and (d) through a growth reaction carried out in the growth chamber, forming the large size, single crystal using the assembly of smaller tiles formed in step (b) as a seed crystal for the growth reaction.

2. The method of claim 1 wherein the smaller seed tiles are assembled in step (b) along substantially the same crystallographic orientation.

3. The method of claim 1 wherein the seed tiles are assembled in step (b) with alternating polarity between adjacent tiles.

4. The method of claim 1 wherein the plurality of smaller tiles assembled into a structure in step (b) is affixed to a holder.

5. The method of claim 4 wherein the plurality of smaller tiles is affixed to the holder with an adhesive.

6. The method of claim 5 wherein the adhesive is a sugar solution.

7. The method of claim 1 wherein the growth reaction of step (d) is first carried out to overgrow the surface of the assembly of smaller tiles and any gaps between adjacent tiles, and then the growth reaction of step (d) is carried out to grow a large size crystal with the overgrown assembly of smaller tiles functioning as a seed crystal for the growth reaction.

8. The method of claim 1 wherein the small size tiles of single crystal and the large size, single crystal grown in the reaction are silicon carbide.

9. The method of claim 1 wherein the growth reaction carried out in the growth chamber is a physical vapor transport reaction.

10. The method of claim 1 wherein the growth reaction carried out in the growth chamber is a physical vapor transport reaction in which: (e) the assembly of smaller tiles and a crystal growth source are introduced into a sublimation system; and (f) the pressure of the system, the temperature of the assembly of smaller tiles, and the temperature of the crystal growth source are adjusted to cause the crystal growth source to vaporize and condense on the assembly of smaller tiles under the conditions required to form a single crystal.

11. The method of claim 10 wherein the assembly of smaller tiles is formed by:

(i) preparing a high quality surface on the smaller tiles so as to promote subsequent crystal growth;

(ii) cutting the tiles prepared in step (i) to form polygonal tile pieces;

(iii) assembling the polygonal tiles/pieces cut in step (ii) into an assembly of smaller tiles;

(iv) affixing the structure formed in step (iii) onto a seed holder; and (v) placing the seed holder with the tiles affixed thereto into the growth chamber for large size, single crystal growth.

12. The method of claim 10 wherein the assembly of smaller tiles is shaped along its outer edges to form a generally circular structure.

13. The method of claim 10 wherein the small size tiles of single crystal and the large size, single crystal grown in the physical vapor transport reaction are silicon carbide.

14. The method of claim 13 wherein the smaller size tiles are assembled so that either all of their C-faces or all of their Si-faces, respectively, are oriented toward the vapor in the growth chamber during the growth reaction process.

15. The method of claim 13 wherein the smaller size tiles are assembled so that some of the C-faces and some of the Si-faces, respectively, are oriented toward the vapor in the growth chamber during the growth reaction process, with the ratio of C-to-Si-faces oriented in this manner chosen so as to improve growth in the reaction process.

* * * * *